United States Patent [19]

Kido et al.

[11] 4,271,256
[45] Jun. 2, 1981

[54] METHOD FOR FORMING IMAGES

[75] Inventors: Keishiro Kido; Minoru Wada; Tomoaki Ikeda, all of Asaka, Japan

[73] Assignee: Fuji Photo Film Co., Ltd., Minami-ashigara, Japan

[21] Appl. No.: 161,533

[22] Filed: Jun. 20, 1980

Related U.S. Application Data

[63] Continuation of Ser. No. 943,901, Sep. 19, 1978, abandoned.

[30] Foreign Application Priority Data

Sep. 19, 1977 [JP] Japan .................................. 52/112402

[51] Int. Cl.³ .............................................. G03C 5/54
[52] U.S. Cl. ................................... 430/253; 430/523; 430/531; 430/536; 430/525; 430/495; 430/496
[58] Field of Search ............................ 96/28, 67, 76 R; 430/253, 255, 523, 531, 536, 525, 495, 496

[56] References Cited

U.S. PATENT DOCUMENTS

| | | | |
|---|---|---|---|
| 3,202,508 | 8/1965 | Heiart | 430/253 |
| 3,219,444 | 11/1965 | Valle et al. | 430/255 |
| 3,645,730 | 2/1972 | Frank et al. | 430/253 |
| 3,664,834 | 5/1972 | Amidon et al. | 430/347 |
| 3,730,717 | 5/1973 | Chu et al. | 430/346 |
| 4,041,204 | 8/1977 | Hepher et al. | 430/253 |
| 4,050,936 | 9/1977 | Takeda et al. | 430/253 |

FOREIGN PATENT DOCUMENTS 52-15703  5/1977  Japan ..................................... 430/495

*Primary Examiner*—Won H. Louie, Jr.
*Attorney, Agent, or Firm*—Sughrue, Rothwell, Mion, Zinn and Macpeak

[57] ABSTRACT

A method for forming images which comprises imagewise exposing a recording element comprising a support having directly or on a subbing layer thereon, as a recording layer, a vacuum deposited layer containing at least about 20% by volume of an organic substance, adhering a strippable film on the surface of the recording layer prior to or after the imagewise exposure, and peeling apart the strippable film from the recording layer after the imagewise exposure, whereby the exposed areas of the recording layer remain on the support and the non-exposed areas are transferred onto the strippable film.

22 Claims, 8 Drawing Figures

METHOD FOR FORMING IMAGES

This is a continuation of application Ser. No. 943,901, filed Sept. 19, 1978, now abandoned.

BACKGROUND OF THE INVENTION

1. Field of the Invention

The present invention relates to a method for forming images which comprises imagewise exposing a recording element comprising a support having thereon, as a recording layer, a vacuum deposited layer containing an organic substance and peeling apart a strippable film, adhered to the surface of the recording layer prior to or after the imagewise exposure, from the recording layer, thus negative images and positive images being formed on the support and the strippable film, respectively.

2. Description of the Prior Art

U.S. Pat. No. 3,787,210 (corresponding to Japanese Patent Publication No. 35144/1976) discloses a method for forming both negative and positive images by irradiation with light such as laser light. This method utilizes a recording film comprising a base plate having coated thereon a substance containing a heat-absorbable material, such as carbon black particles, in a self-oxidizable binder, such as nitrocellulose, and comprises bringing a tape into close contact with the coated layer and then irradiating the coated layer with laser light to thereby cause a blow-off of the heat-absorbable substance in the coated layer to spray the substance onto the tape. In this method, nitrocellulose is burned and blown off to thereby form images. In this method, the resolving power of the images is poor. In particular, where images of high density are formed on the tape, the resolving power of the images is extremely poor. In addition, this method requires a large amount of energy for light exposure.

SUMMARY OF THE INVENTION

An object of the present invention is to provide a method for forming images in which both negative images and positive images of high sensitivity and high resolving power are simultaneously obtained.

Another object of the present invention is to provide a method for obtaining positive images on a strippable film which can be adhered to another film.

A further object of the present invention is to provide a method for obtaining copies of images using light exposure and peel apart development.

Images obtained by making a copy are utilizable, for example, adhered on an original or a photograph in the steps for photo-engraving.

As a result of extensive study as to ease of use, it has been found that by providing a layer relatively weakly adhered onto a support, a strippable film, such as commercially available adhesive tapes, can be used. The present invention has been attained by utilizing on a support a recording layer containing an organic substance formed by vacuum deposition as a recording layer having such a relatively weak adhesion but having a sufficient adhesion as recording materials for practical purposes.

The present invention thus provides a method for forming images which comprises imagewise exposing a recording element comprising a support having directly or on a subbing layer thereon, as a recording layer, a vacuum deposited layer containing at least about 20% by volume of an organic substance, adhering a strippable film to the surface of the recording layer prior to or after the imagewise exposure and then peeling apart the strippable film from the recording layer after the imagewise exposure, whereby the exposed areas of the recording layer remain on the support and the non-exposed areas of the recording layer are transferred to the strippable film.

DETAILED DESCRIPTION OF THE INVENTION

Figure 1:
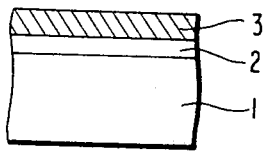
FIGS. 1 through 8 show examples of the layer structure of the recording element employed in the present invention; wherein 1 is a support, 2 is an organic substance layer, 3 is a metal layer, 4 is an inorganic compound layer, 5 is a layer in which a metal and an inorganic compound are co-present, and 6 is a layer in which an organic substance and a metal or an inorganic compound are co-present.

Suitable supports which can be employed in the present invention can be any known supports used for conventional recording materials, such as synthetic resin, paper, glass, and the like. The supports used can be either transparent or opaque, and, further, can be flexible or rigid. The supports can be appropriately chosen depending upon the purpose of image formation in accordance with the present invention. The thickness of the support is not particularly limited, and any support can be used, as long as the support is not destroyed or damaged when the strippable film is peeled apart and the image is maintained flat.

The recording layer containing an organic substance which is formed by vacuum deposition can be a layer of an organic substance alone formed by deposition techniques, such as a vacuum deposition, sputtering, etc., and further can be a layer formed by vacuum deposition of metals or inorganic compounds simultaneously together with the organic substances in which the organic substances and other substances such as metals and/or inorganic compounds are co-present. In this case, the organic substance is present in an amount of about 20% by volume or more in the recording layer.

The recording layer containing the organic substance which is formed on the support by vacuum deposition can be a single layer containing the above-described organic substance provided on the support, or the recording layer can further comprise a layer of the organic substance with a layer containing metals, inorganic compounds or organic substances thereon.

Further, a protective layer can also be provided on the surface of the recording layer. The protective layer when used in the present invention prevents the surface of the recording layer from being abraded, and is particularly effective where the recording layer has a metal surface. Suitable materials for the protective layer include organic compounds and inorganic compounds and such a protective layer can be used so long as it does not impair the ability of the adhesive tape or strippable film to ultimately remove portions of the recording layer in an imagewise manner after imagewise exposure. The thickness of the protective layer can vary depending upon the kind of the materials used for the protective layer, but, generally, ranges from about $0.1\mu$ to about $10\mu$.

The recording layer has, as a whole, an optical density of about 0.3 or above, and this optical density can be appropriately determined depending upon the purpose of use of the recording element. An optical density of more than 1.0 to 1.5 is preferred when a transmission type material is used for projection, and when the image obtained is employed in the steps for engraving, an optical density of about 3.0 is needed in some cases. The optical density is predominantly determined by the amount of light-absorbing materials, such as metals, dyes or pigments, which are present.

In addition, the term "on a support" as used herein is intended to include a recording layer present directly on the support and also a recording layer present on a so-called subbing layer provided on the surface of the support. Such a subbing layer can be provided on the support, e.g., by coating, e.g., chlorinated polyethylene, in a thickness of, e.g., about $0.2\mu$.

The imagewise exposure of the recording element can be by irradiation with a luminous flux having an imagewise distribution, e.g., using a strobe light through an original image or can be by irradiation by scanning the recording layer with a small luminous flux, e.g., by scanning with a laser beam.

It is generally preferred for the strippable film to be transparent and flexible, for example, to be a pressure-sensitive adhesive tape. Positive images are formed as images on this strippable film and, hence, where the film is attached to other material, e.g., an original photograph for engraving, the strippable film is preferably transparent and flexible, in particular. While not limiting, generally a suitable transparency is about 80% or higher, preferably 97% or above. However, a colored film or a film having poor transparency may be used for certain purposes. Further, where negative images formed on the support are simply utilized as images, the strippable film can be opaque. In addition, where the support is transparent, it is not necessary for the strippable film to be transparent so long as peeling apart of the strippable film is possible. The strippable film must possess strength that the strippable film is not destroyed when such is peeled off the recording layer. The adhesion of the strippable film can be carried out by attaching a pressure-sensitive adhesive tape thereto after the imagewise exposure, or by laminating a transparent synthetic resin film on the recording layer prior to the imagewise exposure. A suitable example of a strippable film is a commercially available cellophane adhesive tape (e.g., Cello-Tape, trade name made by Nichiban Co., Ltd.).

The amount of light used in the imagewise exposure in the present invention can be to an extent where images are formed by peeling off the strippable film. However, the amount of light used is preferably to the extent where the optical density at the exposed areas is somewhat reduced and images are discernable. The degree of optical density reduction will, of course, depend on the initial optical density of the recording layer, e.g., when the initial density is 3.0, a reduction degree in optical density is preferably more than 1.0, and when the initial density is 1.3, even a reduction degree of even 0.1 is sufficient. Particularly, where only positive images which are to be transferred to the strippable film are utilized, the light for imagewise exposure can be sufficiently strong that the exposed areas are completely melted or evaporated off to become almost transparent.

The peeling off of the strippable film in the present invention requires that the adhesion between the strippable film and the surface of the recording layer be greater than the adhesion between the support and the organic substance layer. Any technique for peeling off the strippable film can be used so long as the strippable film is peeled off, for example, manually.

The metals and inorganic compounds which can be employed in accordance with the present invention and used in the recording layer are known. A variety of metals can be employed in the present invention. For example, suitable metals are disclosed in Japanese Patent Application (OPI) No. 20821/1977 (The term "OPI" as used herein refers to a "published unexamined Japanese patent application"). Particularly from a practical viewpoint, Mg, Mn, Cu, Zn, Al, In, Sn, Bi, etc., are preferred. Of these, In, Sn, Bi, etc., are particularly preferred metals in view of the low melting point and the low reflectivity thereof. These metals can be employed in the present invention, individually or in combination, or as an alloy thereof.

Examples of inorganic compounds which can be employed in the present invention include metal sulfides, such as $CrS$, $CrS_2$, $Cr_2S_3$, $MoS_2$, $FeS$, $FeS_2$, $CoS$, $NiS$, $Ni_2S$, $Cu_2S$, $Ag_2S$, $ZnS$, $In_2S_3$, $In_2S_2$, $GeS_x$ (wherein x is a positive real number of 2.5, or less), $SnS$, $SnS_2$, etc.; metal fluorides, such as $MgF_2$, $CaF_2$, $RhF_3$, etc.; metal oxides, such as $MoO_3$, $InO$, $In_2O$, $In_2O_3$, $GeO$, etc.; a variety of halides as disclosed in Japanese Patent Application (OPI) No. 83617/1978. $AgI$, $AgBr$, $AgCl$, $PbI_2$, $PbBr_2$, $PbCl_2$, $PbF_2$, $SnI_2$, $SnCl_2$, $CuI$, $CuBr$, $CuCl$, $KI$, $KCl$, etc., are especially preferred.

Of these inorganic materials, metals are preferred in order to enhance the optical density of the recording layer, and further in order to increase the recording sensitivity, the co-presence of metals and the inorganic compounds is preferred. However, where the optical density of the recording layer can be relatively low, no metal needs to be used with the inorganic material.

Suitable organic substances which can be employed as the organic substance layer which is used in accordance with the present invention include a variety of organic compounds. The organic substance need only be solid at normal temperature, e.g., less than about 40° C., preferably less than about 25° C., and be capable of being vacuum deposited. It is preferred for the melting point, the sublimation point, etc., to be as low as possible, and organic substances having good stability, either prior to or after deposition of the organic substances, are preferred. However, in the case of organic substances, the melting point, sublimation temperature, etc., are mostly up to around 350° C. so that most organic substances can be used.

For example, organic carboxylic acids are preferred organic substances which can be employed in the present invention, and preferred examples thereof include higher fatty acids exemplified by behenic acid, stearic acid, palmitic acid, myristic acid, etc.; aromatic carboxylic acids exemplified by phthalic acid, isophthalic acid, pyromellitic acid, anisic acid, coumaric acid, cinnamic acid, etc.; polycarboxylic acids exemplified by fumaric acid, succinic acid, sebacic acid, oxalic acid, pimellic acid, etc.; abietic acid, etc. The salts and esters of these acids are also preferred. In addition, aromatic sulfonic acids, such as sulfanilic acid, are also preferred organic substances. High molecular weight organic compounds are also preferred organic substances and examples thereof include polymethacrylic acid, polystyrene, polyamides (e.g., nylon), polyvinyl alcohol, polyethylene glycol, methyl cellulose, polyvinyl butyral, poly(methyl methacrylate), poly(isobutyl methacrylate), polyethylene, rosin resin, etc. Organic non-cyclic sulfur compounds are also preferred organic substances and examples thereof include thiourea and derivatives thereof, thiosemicarbazides, such as dithizone, etc., and derivatives thereof; thiocarbamic acids, such as diethyldithiocarbamic acid, etc., and derivatives thereof; thiobenzophenone and derivatives thereof. Heterocyclic compounds containing nitrogen or sulfur as hetero atoms are also preferred organic substances and examples thereof include imidazole and derivatives thereof, e.g., benzimidazole, 2-mercaptobenzimidazole, etc.; triazole and derivatives thereof, e.g., benzotriazole, etc.; tetrazole and derivatives thereof, such as mercaptophenyltetrazole, etc.; thiazole and derivatives thereof, such as benzothiazole, 2-mercaptobenzothiazole, 2-aminobenzothiazole, etc. In addition, dyes and pigments are also preferred organic substances and examples thereof include basic dyes, such as methylene blue, etc.; acidic dyes, such as Orange II; vat dyes, such as indanthrone; mordant dyes, such as Alizarine Red S; sulfur dyes, such as Sulfur Black T; oil-soluble dyes, such as Sudan II; disperse dyes, such as Cellitone Fast Violet B; phthalocyanine pigments, anthraquinone type pigments, quinoline type pigments, etc. These organic substances can be employed in the present invention individually or as a suitable combination thereof.

Examples of basic structures of the recording layer employed in the recording element used in the present invention are those as shown in FIGS. 1 through 8. Although a protective layer or a subbing layer is not illustrated in these figures, these layers can be additionally present as described hereinbefore. In addition, these additional layers are composed of conventionally known substances. In the respective figures, 1 is a support, 2 is a layer of an organic substance, 3 is a metal layer, 4 is a layer of an inorganic compound, and 5 is a layer in which a metal and an inorganic compound are co-present. In addition, layer 3, 4 or 5 can also contain the organic substance. A major role of layer 3 is absorption of light.

Figure 7:
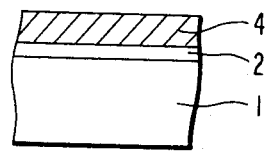
Figure 8:

FIG. 1 shows an embodiment comprising support 1 having thereon an organic substance layer 2 and further thereon a metal layer 3. FIGS. 2 through 5 show an embodiment further having an inorganic compound layer 4 for light absorption in contact with the metal layer 3. FIG. 6 shows an embodiment further having a layer 5 in which the metal and inorganic compound are co-present using co-deposition, etc., on the organic substance layer. FIG. 7 shows an embodiment further having an inorganic compound layer 4 on the organic substance layer 2. This layer 4 can also contain the organic substance, e.g., the layer can also be composed of light absorbable inorganic compounds, dyes, pigments, etc. FIG. 8 shows an embodiment comprising a support having thereon a layer 6 in which the organic substance and a metal or inorganic compound are co-present.

It is preferred for the thickness of the organic substance layer 2 to be about 100 Å or greater. Where the thickness is less than about 100 Å, it is impossible for the organic substance to completely cover the surface of the support as a layer thereof so that the peeling apart cannot be completely accomplished. The thickness of the other layers 3, 4 and 5 can be optionally determined depending upon the optical density, the recording sensitivity and the substance used. The thickness of mixed layer 6 is not particularly limited, either, so long as the organic substance is present therein in an amount corresponding to a thickness of about 100 Å or greater and the amount of the organic substance in the layer 6 is more than 20% by volume.

The present invention can be utilized for attaching characters, attaching name plates, etc., to photographs, originals, etc., in the field of the graphic arts.

The present invention is explained in greater detail by reference to the examples given below.

EXAMPLE 1

The layers as shown in Table 1 below were formed on a polyethylene terephthalate support having a thickness of 100μ at a degree of vacuum for deposition of $5 \times 10^{-5}$ Torr to form recording layers. Each of the recording layers was exposed to light through a mask of metal images using Tranpenup TU-260 (trade name, manufactured by the Riso Kagaku K. K.). Then, a polyester adhesive tape was attached to the surface of each of the respective recording layers and immediately peeled off. The non-exposed areas were transferred to the tape with positive images being obtained, and the exposed areas remained on the support with negative images being obtained. The adhesive tapes having the positive images thereon were then attached to a sheet of white paper or a glass plate. Extremely clear images without any fog were obtained.

TABLE 1

Figure 5:
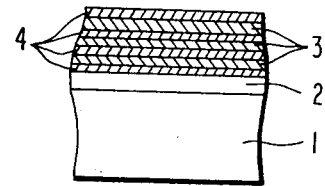
Figure 2:
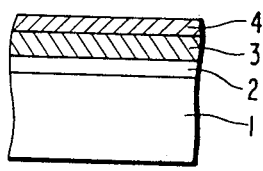
Figure 6:
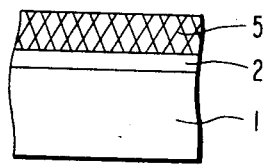
Figure 3:
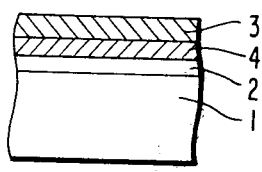
Figure 4:
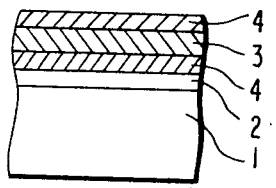

| Sample No. | Organic Substance Layer (layer thickness) | Metal Layer (layer thickness) | Inorganic Compound Layer (layer thickness) | Layer Structure |
|---|---|---|---|---|
| 1 | Fumaric acid and hydrogenated rosin | 1,500 A | Sn 300 A | SnS 400 A | FIG. 2 |
| 2 | Fumaric acid and hydrogenated rosin | 1,500 A | Sn 300 A | SnS 200 A × 2 | FIG. 4 |
| 3 | Fumaric acid and hydrogenated rosin | 1,500 A | Sn 100 A × 3 | SnS 100 A × 4 | FIG. 5 |
| 4 | Fumaric acid and hydrogenated rosin | 1,500 A | Sn 300 A + SnS 400 A | | FIG. 6 |

EXAMPLE 2

The metals (as inorganic substances) and organic substances as shown in Table 2 below were co-deposited onto a polyethylene terephthalate support having a thickness of 100μ to form recording layers. Recording elements were thus prepared. The layer thickness described in Table 2 corresponded to the thickness of the layers formed when each substance was deposited individually. The deposition was conducted in a vacuum deposition apparatus, in which the metal and organic substance were placed at two evaporation sources, respectively, which were in separate sections from each other, and a degree of vacuum of about $5 \times 10^{-5}$ Torr was used. After closing the respective shutters so that deposition onto the support would not occur on the support, the substances in the evaporation sources were heated while monitoring the thicknesses of each deposit of the metal and the organic substance, thereby appropriate temperature conditions for vaporization of the metal and organic substance was determined. The support was passed at a set velocity through the vacuum deposition apparatus. Then, both shutters were simultaneously opened to co-deposit the metal and organic substance onto the support at a fixed velocity, thereby forming recording elements.

The optical density of each of the recording element is also shown in Table 2.

A pattern mask was brought into close contact with each of the recording layers of these recording elements. The recording layers were exposed through the pattern mask to light from a stroboscope, XENOFAX 150 Model (trade name, made by the Riso Kagaku K.K.) using the weakest exposure setting for the stroboscope. The areas of each of the recording elements exposed through the mask had reduced transmittance and images corresponding to the mask were obtained. Next, an adhesive tape (Cello-Tape, produced by Nichiban Co. Ltd.) was attached to the surface of each of the recording layers and then peeled off. The exposed areas of the recording layers remained on the support and the non-exposed areas were transferred onto the adhesive tape. That is, negative images with respect to the mask were formed on the support and, at the same time, positive images with respect to the mask were formed on the adhesive tape. The adhesive tape bearing the positive images was attached to a transparent support or onto a white support. Clear positive images without any fog were obtained. The elements having an amount of the organic substance deposited of 80% or more (calculated as layer thickness) to the amount of the inorganic substance deposited showed good peeling off property described above. In addition, with the recording elements for comparison, Sample Nos. 11 and 16, images were not obtained even if the strongest exposure amount was employed using the above-described apparatus, nor were images formed due to peeling off.

TABLE 2

| Sample No. | Substances Co-Deposited | | | | Density |
|---|---|---|---|---|---|
| | Inorganic Substance | Layer Thickness (Å) | Organic Substance | Layer Thickness (Å) | |
| 1 | In | 500 | Sebacic acid | 1,900 | 1.35 |
| 2 | In | 550 | Sebacic acid | 1,700 | 2.05 |
| 3 | In | 500 | Pyromellitic anhydride | 1,000 | 1.35 |
| 4 | In | 400 | Sebacic acid | 800 | 1.20 |
| 5 | In | 400 | Thiourea | 400 | 1.32 |
| 6 | In | 400 | 2-Mercapto-5-lauroamidobenzimidazole | 400 | 1.41 |
| 7 | In | 400 | p-Ethylbenzene sulfonate | 400 | 1.31 |
| 8 | In | 400 | Quinacridone | 400 | 2.00 |
| 9 | In | 400 | Tetraiodofluorescein | 1,400 | 1.45 |
| 10 | In | 430 | Erythrocine | 110 | 3.20 |
| 11 | In | 400 | None | 0 | — |
| 12 | In | 600 | 3-Iodobenzanthrone | 200 | — |
| 13 | In | 600 | 3-Iodobenzanthrone | 300 | — |
| 14 | In | 600 | 3-Iodobenzanthrone | 400 | — |
| 15 | In | 600 | 3-Iodobenzanthrone | 600 | — |
| 16 | In | 600 | None | 0 | — |

"—" in the table means not measured.

While the invention has been described in detail and with reference to specific embodiments thereof, it will be apparent to one skilled in the art that various changes and modifications can be made therein without departing from the spirit and scope thereof.

What is claimed is:

1. A method of forming images which comprises imagewise exposing to light or electromagnetic radiation a recording element comprising a support having directly or on a subbing layer thereon, as a recording layer, a vacuum deposited layer consisting essentially of at least about 20% by volume of an organic substance having good stability which is solid at less than about 40° C. and which is capable of being vacuum deposited and at least one of indium, tin or bismuth and an inorganic compound which is a metal sulfide selected from the group consisting of $CrS$, $CrS_2$, $Cr_2S_3$, $MoS_2$, $FeS$, $FeS_2$, $CoS$, $NiS$, $Ni_2S$, $Cu_2S$, $Ag_2S$, $ZnS$, $In_2S_3$, $In_2S_2$, $GeS_x$ wherein x is a positive number of 2.5 or less, $SnS$, $SnS_2$ and mixtures thereof, a metal fluoride selected from the group consisting of $MgF_2$, $CaF_2$, $RhF_3$ and mixtures thereof, a metal oxide selected from the group consisting of $MoO_3$, $InO$, $In_2O$, $In_2O_3$, $GeO$, and mixtures thereof, or a halide selected from the group consisting of $AgI$, $AgBr$, $AgCl$, $PbI_2$, $PbBr_2$, $PbCl_2$, $PbF_2$, $SnI_2$, $SnCl_2$, $CuI$, $CuBr$, $CuCl$, $KI$, $KCl$ and mixtures thereof, for light absorption to increase optical density and recording sensitivity, adhering a strippable film on the surface of said recording layer either prior to or after said imagewise exposure and peeling apart said strippable film from said recording layer after said imagewise exposure, whereby the exposed areas of said recording layer remain on the support and the non-exposed areas are transferred onto said strippable film, wherein said organic substance is at least one compound selected from the group consisting of higher fatty acids, aromatic carboxylic acids, polycarboxylic acids, abietic acid, salts of said acids, aromatic sulfonic acids, polymethacrylic acid, polystyrene, polyamides, polyvinyl alcohol, polyethylene glycol, methyl cellulose, polyvinyl butyral, poly(methyl methacrylate), poly(isobutyl methacrylate), polyethylene, rosin resin, thioureas, thiosemicarbazides, thiocarbamic acids, thiobenzophenones, imidazoles, triazoles, tetrazoles, thiazoles, basic dyes, acidic dyes, vat dyes, mordant dyes, sulfur dyes, oil-soluble dyes, disperse dyes, phthalocyanine pigments, anthraquinone type pigments and quinoline type pigments.

2. A method for forming images which comprises imagewise exposing to light or electromagnetic radiation a recording element comprising a support having directly or on a subbing layer thereon, as a recording layer, a vacuum deposited layer consisting essentially of an organic substance having good stability which is solid at less than about 40° C. and which is capable of being vacuum deposited and a vacuum deposited layer of at least one of indium, tin or bismuth, an inorganic compound which is a metal sulfide selected from the group consisting of $CrS$, $CrS_2$, $Cr_2S_3$, $MoS_2$, $FeS$, $FeS_2$, $CoS$, $NiS$, $Ni_2S$, $Cu_2S$, $Ag_2S$, $ZnS$, $In_2S_3$, $In_2S_2$, $GeS_x$ wherein x is a positive number of 2.5 or less, $SnS$, $SnS_2$ and mixtures thereof, a metal fluoride selected from the group consisting of $MgF_2$, $CaF_2$, $RhF_3$ and mixtures thereof, a metal oxide selected from the group consisting of $MoO_3$, $InO$, $In_2O$, $In_2O_3$, $GeO$, and mixtures thereof, or a halide selected from the group consisting of $AgI$, $AgBr$, $AgCl$, $PbI_2$, $PbBr_2$, $PbCl_2$, $PbF_2$, $SnI_2$, $SnCl_2$, $CuI$, $CuBr$, $CuCl$, $KI$, $KCl$ and mixtures thereof, for light absorption to increase optical density and recording sensitivity, on said layer of said organic substance, adhering a strippable film on the surface of said recording layer either prior to or after said imagewise exposure and peeling apart said strippable film from said recording layer after said imagewise exposure, whereby the exposed areas of said recording layer remain on the support and the non-exposed areas are transferred onto said strippable film, wherein said organic substance is at least one compound selected from the group consisting of higher fatty acids, aromatic carboxylic acids, polycarboxylic acids, abietic acid, salts or esters of said acids, aromatic sulfonic acids, polymethacrylic acid, polystyrene, polyamides, polyvinyl alchol, polyethylene glycol, methyl cellulose, polyvinyl butyral, poly(methyl methacrylate), poly(isobutyl methacrylate), polyethylene, rosin resin, thioureas, thiosemicarbazides, thiocarbamic acids, thiobenzophenones, imidazoles, triazoles, tetrazoles, thiazoles, basic dyes, acidic dyes, vat dyes, mordant dyes, sulfur dyes, oil-soluble dyes, disperse dyes, phthalocyanine pigments, anthraquinone type pigments and quinoline type pigments.

3. The method of claim 1 or 2, wherein said strippable film is adhered on the surface of said recording layer prior to said imagewise exposure.

4. The method of claim 1 or 2, wherein said strippable film is adhered to said recording layer after said imagewise exposure.

5. The method of claim 1 or 2, wherein said support is transparent or opaque.

6. The method of claim 1 or 2 wherein said support is a support of a synthetic resin, paper, or glass.

7. The method of claim 1, wherein said recording layer is directly on said support.

8. The method of claim 1, wherein said recording element includes a subbing layer between said support and said recording layer.

9. The method of claim 7, wherein said recording element includes a protective layer on said recording layer.

10. The method of claim 2, wherein said recording element comprises said support and, a said recording layer, a vacuum deposited layer of said organic substance, a vacuum deposited metal layer on said layer of said organic substance and additionally a vacuum deposited layer of said inorganic compound on said metal layer.

11. Th method of claim 2, wherein the vacuum deposited layer of said indium, tin or bismuts, inorganic compound or mixture thereof additionally contains an organic substance which is at least one compound selected from said group of organic substances.

12. The method of claim 1 or 2, wherein the vacuum deposited layer containing said organic substance has a thickness of about 100 Å or greater.

13. The method of claims 1 or 2, wherein said inorganic compound is said metal sulfide.

14. The method of claims 1 or 2, wherein said inorganic compound is said metal fluoride.

15. The method of claims 1 or 2, wherein said inorganic compound is said metal oxide.

16. The method of claims 1 or 2, wherein said inorganic compound is said halide.

17. The method of claims 1 or 2, wherein said organic substance is selected from the group consisting of a higher fatty acid, an aromatic carboxylic acid, a polycarboxylic acid, abietic acid, or a salt or ester thereof or polymethacrylic acid.

18. The method of claims 1 or 2, wherein said organic substance is an aromatic sulfonic acid.

19. The method of claims 1 or 2, wherein said organic substance is selected from the group consisting of polystyrene, polyamides, polyvinyl alcohol, polyethylene glycol, methyl cellulose, polyvinyl butyral, poly(methyl methacrylate), poly(isobutyl methacrylate), polyethylene or rosin resin.

20. The method of claims 1 or 2, wherein said organic substance is selected from the group consisting of thioureas, thiosemicarbazides, thiocarbamic acid acids and thiobenzophenones.

21. The method of claims 1 or 2, wherein said organic substance is selected from the group consisting of imidazoles, triazoles, tetrazoles and thiazoles.

22. The method of claims 1 or 2, wherein said organic substance is selected from the group consisting of basic dyes, acidic dyes, vat dyes, mordant dyes, sulfur dyes, oil-soluble dyes, disperse dyes, phthalocyanine pigments, anthraquinone type pigments and quinoline type pigments.

* * * * *